US 6,544,430 B2

(12) United States Patent
McCormack et al.

(10) Patent No.: US 6,544,430 B2
(45) Date of Patent: Apr. 8, 2003

(54) METHODS FOR DETACHING A LAYER FROM A SUBSTRATE

(75) Inventors: Mark Thomas McCormack, Livermore, CA (US); James Roman, Sunnyvale, CA (US); Lei Zhang, San Jose, CA (US); Solomon I. Beilin, San Carlos, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/872,795

(22) Filed: May 31, 2001

(65) Prior Publication Data

US 2002/0106522 A1 Aug. 8, 2002

Related U.S. Application Data

(63) Continuation-in-part of application No. 09/376,645, filed on Aug. 18, 1999, now Pat. No. 6,391,220.

(51) Int. Cl.[7] ............................................. C03C 25/68
(52) U.S. Cl. ..................... 216/67; 216/40; 216/58; 438/697; 438/706; 438/976; 156/246; 156/247; 156/248; 156/272.2; 156/272.6; 156/273.3; 156/273.9; 29/846; 29/849; 427/569; 427/576; 427/579
(58) Field of Search ........................... 216/40, 58, 67; 438/694, 706, 976; 156/246, 247, 248, 272.2, 272.6, 273.3, 273.9; 29/846, 849; 427/569, 576, 579

(56) References Cited

U.S. PATENT DOCUMENTS

| 4,480,288 A | 10/1984 | Gazdik et al. ............... 361/398 |
| 4,499,152 A | 2/1985 | Green et al. ................ 428/448 |
| 4,517,051 A | 5/1985 | Gadzik et al. .............. 156/644 |
| 4,650,545 A | 3/1987 | Laakso et al. .............. 156/655 |
| 4,711,791 A | 12/1987 | Wiseman et al. ............. 427/96 |
| 4,812,191 A | 3/1989 | Ho et al. .................... 156/239 |
| 4,995,941 A | 2/1991 | Nelson et al. .............. 156/630 |
| 5,153,044 A | 10/1992 | Chen et al. |
| 5,188,704 A | 2/1993 | Babie et al. |
| 5,234,522 A * | 8/1993 | Suzuki et al. ............... 156/249 |
| 5,268,065 A | 12/1993 | Grupen-Shemanski ...... 156/630 |
| 5,534,094 A * | 7/1996 | Arjavalingam et al. ..... 156/155 |
| 5,614,277 A | 3/1997 | Beilstein, Jr. et al. ..... 428/40.1 |
| 5,653,019 A | 8/1997 | Berhardt et al. ............. 29/840 |
| 5,720,099 A | 2/1998 | Parker et al. ................ 29/825 |
| 5,721,007 A | 2/1998 | Lynch et al. ................ 427/98 |

(List continued on next page.)

FOREIGN PATENT DOCUMENTS

| JP | 63-244796 | 12/1988 | ............ H05K/3/46 |

OTHER PUBLICATIONS

Fach et al., "High–flexible Multilayer Substrates with 30mm Vias for Highest Connection and Packaging Density", FLEXCONÔ '97, 1997 Semiconductor Technology Center, Inc., pp. 111–116.*

Fach et al., "High–flexible Multilayer Substrates with 30 μm Vias for Highest Connection and Packaging Density," FLEXCON™ '97, 1997 Semiconductor Technology Center, Inc., pp. 111–116.

Primary Examiner—Randy Gulakowski
Assistant Examiner—M. Kornakov
(74) Attorney, Agent, or Firm—Coudert Brothers LLP

(57) ABSTRACT

Improved methods and articles used to fabricate flexible circuit structures are disclosed. The methods include depositing a release layer or a dielectric film on a substrate, and then forming a conductive laminate on the release layer or the dielectric film. The conductive laminate may be easily separated by the substrate to eventually form a flexible circuit structure. Plasma may be used to treat a surface of the release layer or the dielectric film to produce a plasma-treated surface to lower the peel strength of any film or layer bound to the plasma-treated surface.

8 Claims, 9 Drawing Sheets

U.S. PATENT DOCUMENTS

| | | |
|---|---|---|
| 5,753,044 A | 5/1998 | Hanawa et al. |
| 5,759,417 A | 6/1998 | Inaba .......................... 216/18 |
| 5,779,870 A | 7/1998 | Seip ............................ 205/77 |
| 5,798,050 A | 8/1998 | Gaynes et al. ................ 216/20 |
| 5,822,856 A | 10/1998 | Bhatt et al. ................... 29/832 |
| 5,905,117 A * | 5/1999 | Yokotsuka et al. ......... 428/421 |
| 5,914,165 A | 6/1999 | Freedman .................. 428/40.1 |
| 5,937,512 A * | 8/1999 | Lake et al. .................. 156/233 |
| 6,060,175 A * | 5/2000 | Swisher ...................... 428/612 |
| 6,194,076 B1 * | 2/2001 | Matienzo et al. ........... 428/458 |
| 6,350,844 B1 * | 2/2002 | Ono et al. ................. 428/411.1 |

\* cited by examiner

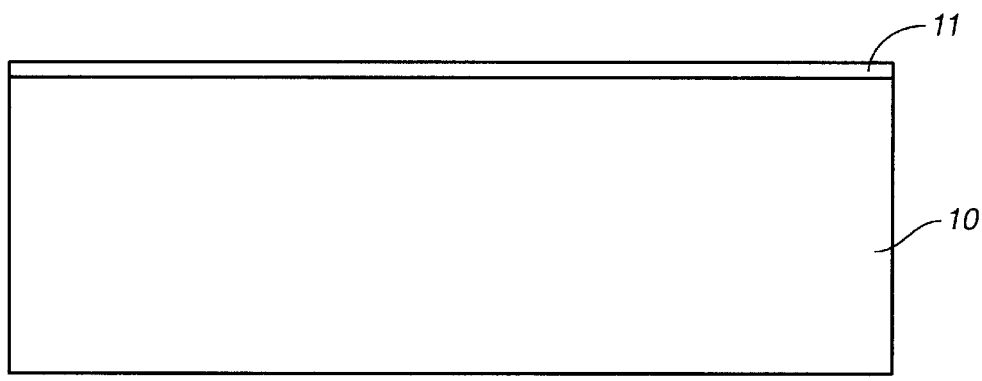
FIG._1
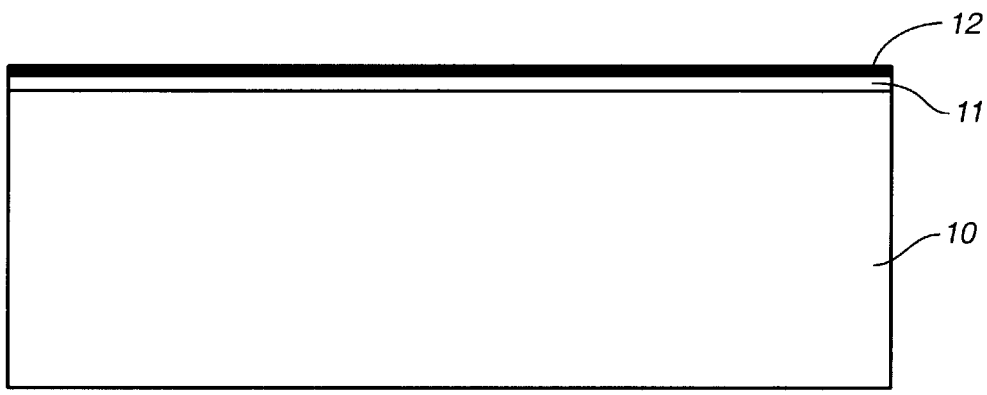
FIG._2
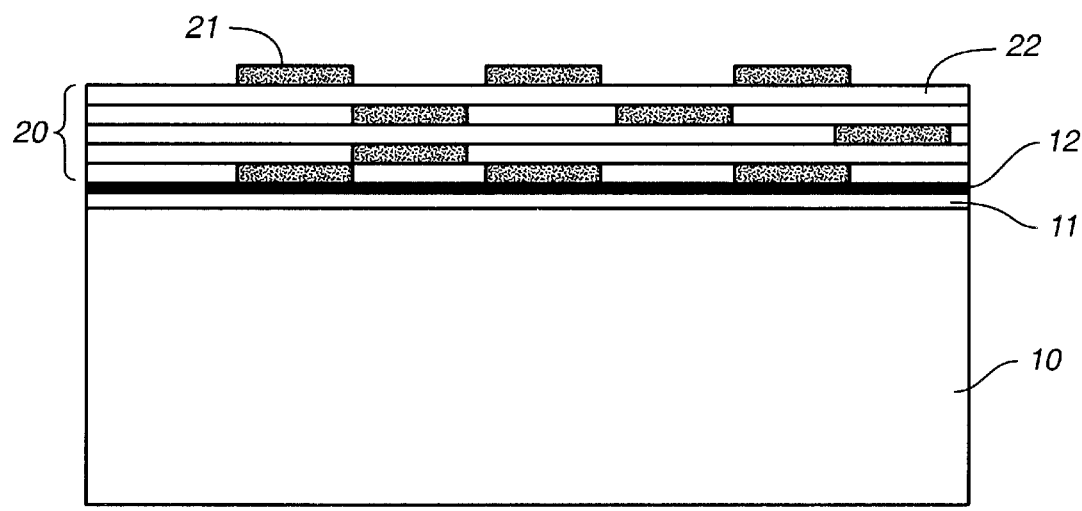
FIG._3

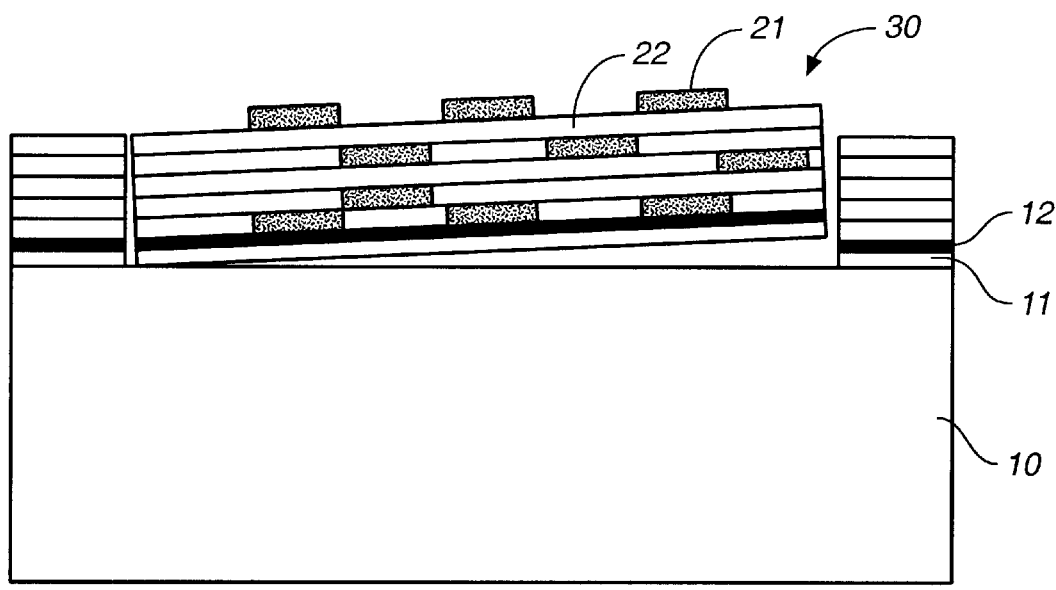
FIG._4
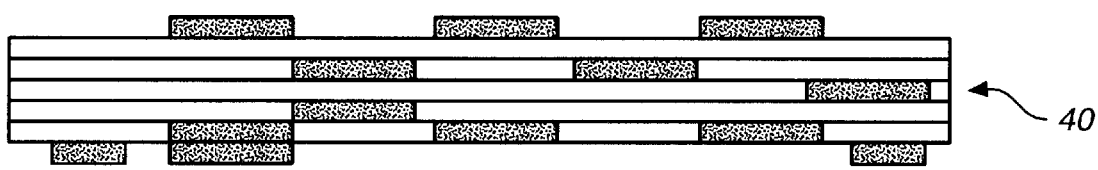
FIG._5

FIG._6
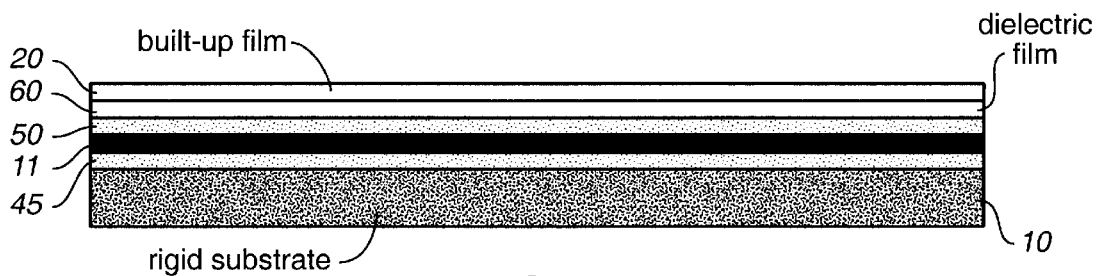
FIG._7
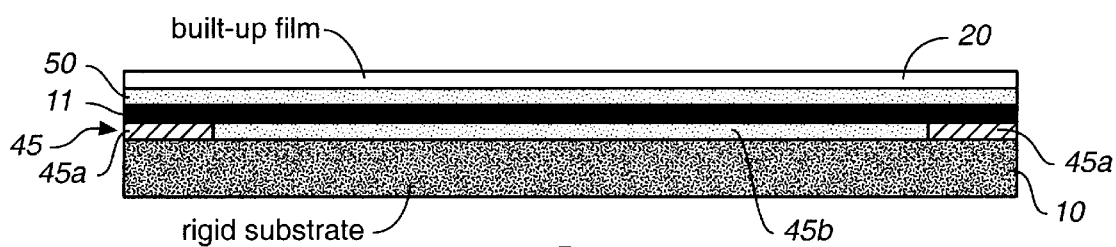
FIG._8
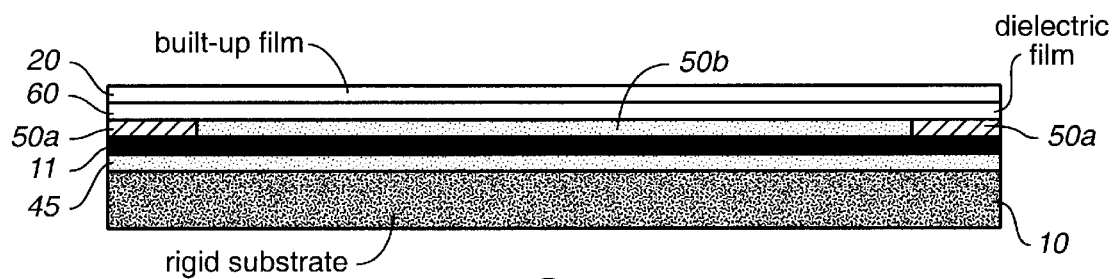
FIG._9

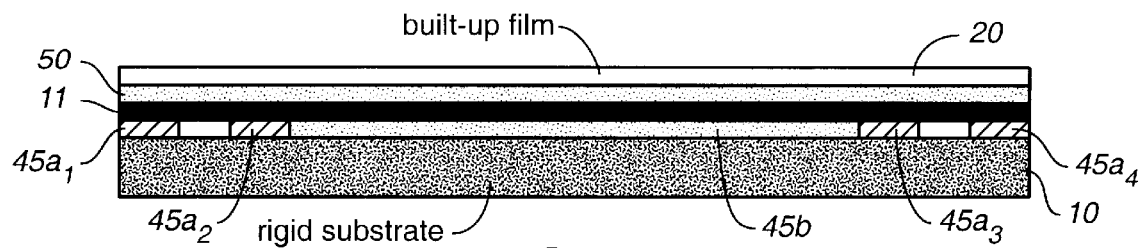
FIG._10
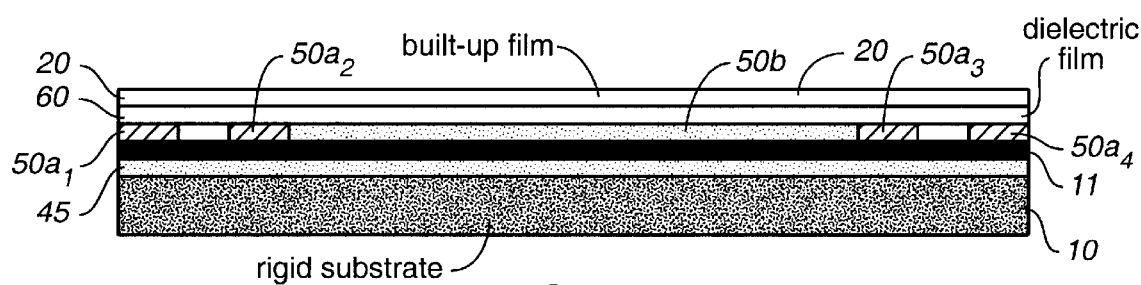
FIG._11
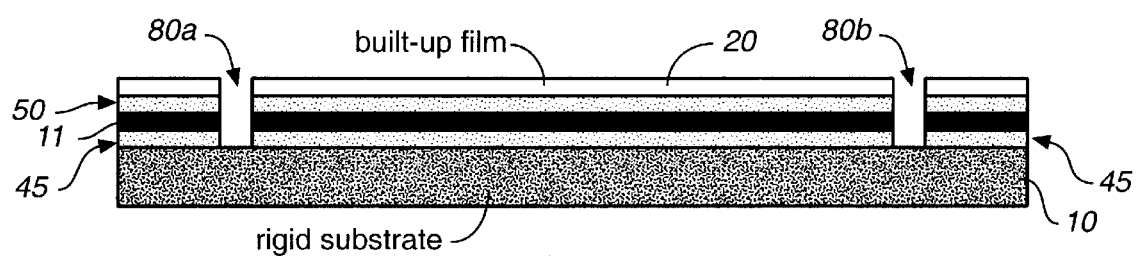
FIG._12
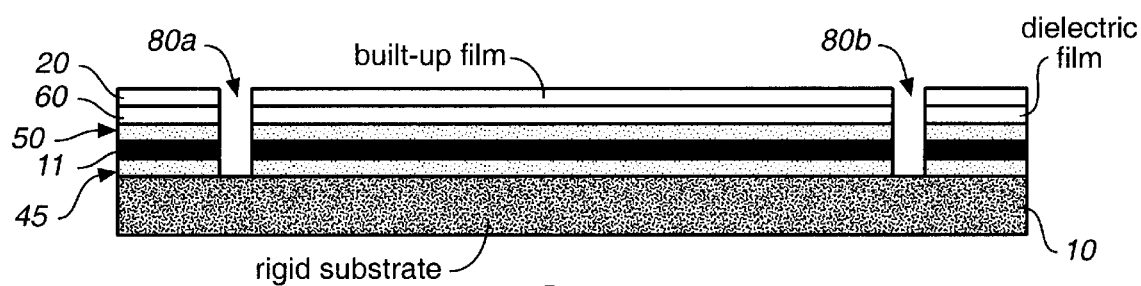
FIG._13

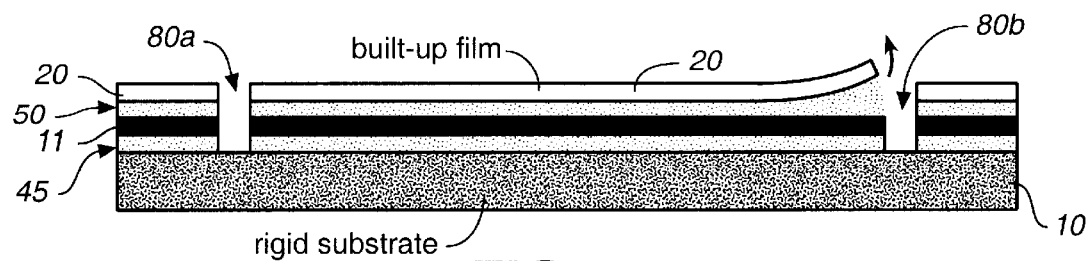
FIG._14
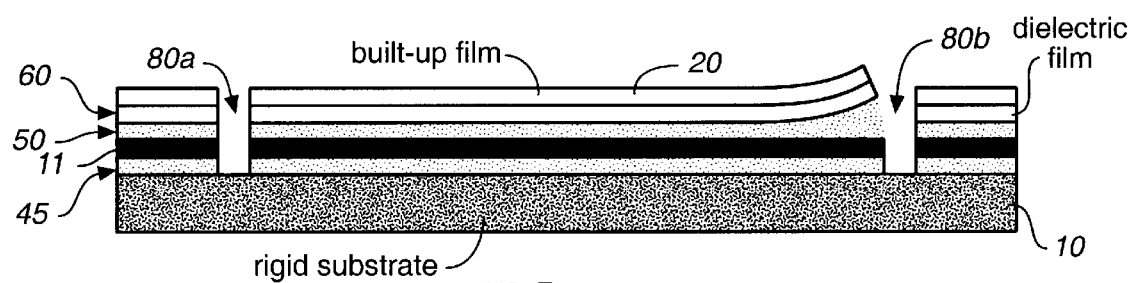
FIG._15
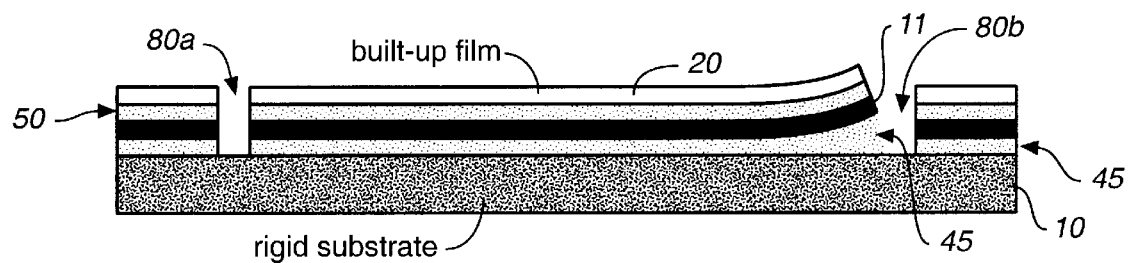
FIG._16
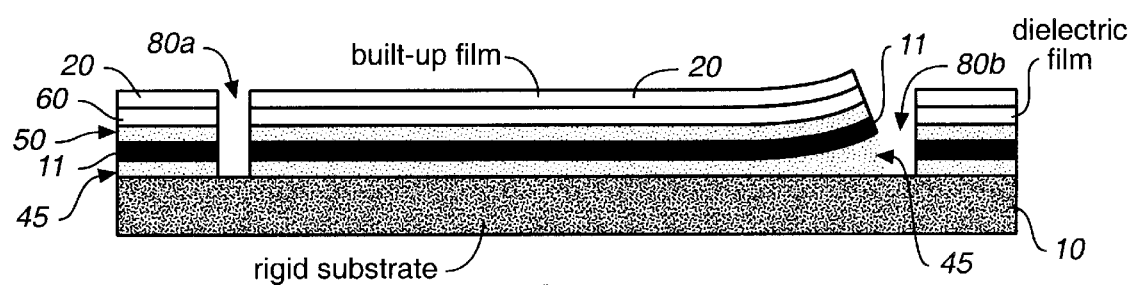
FIG._17

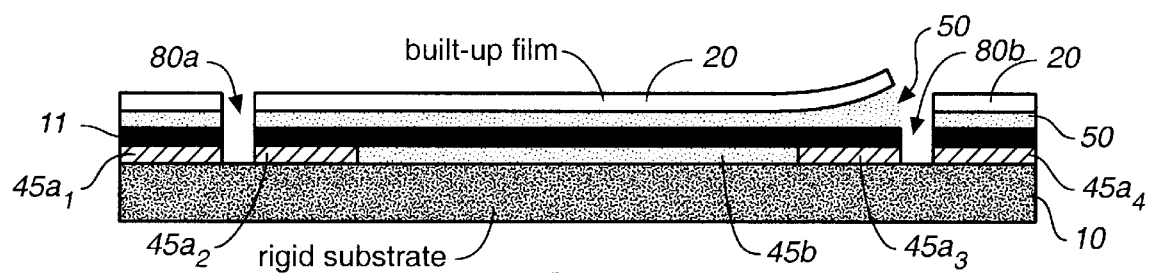
FIG._18
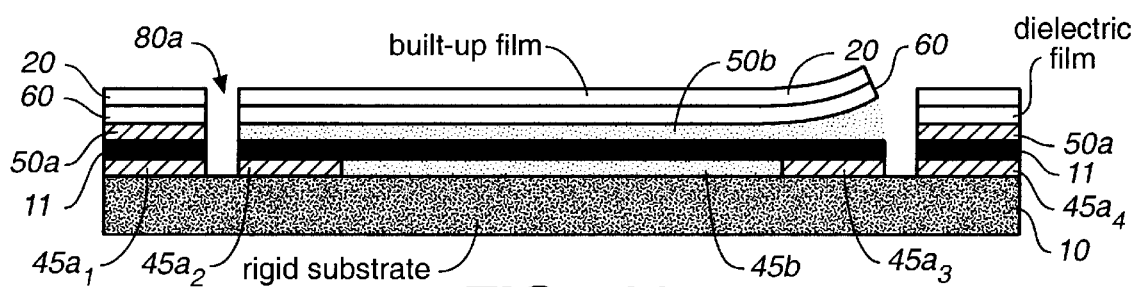
FIG._19
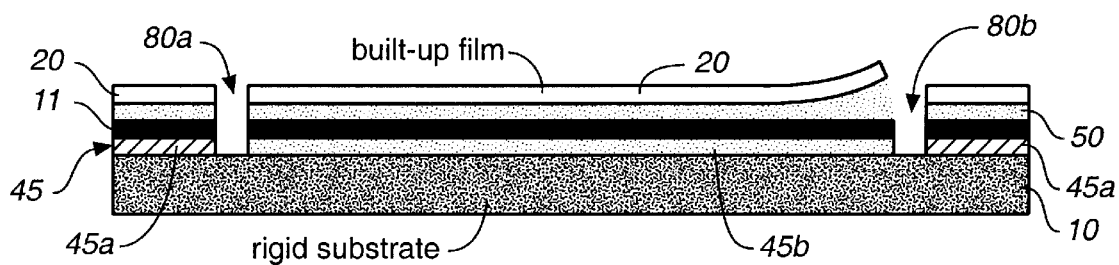
FIG._20
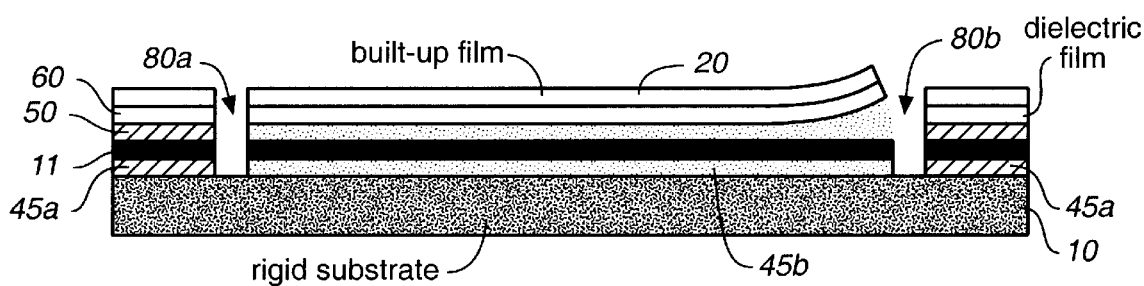
FIG._21

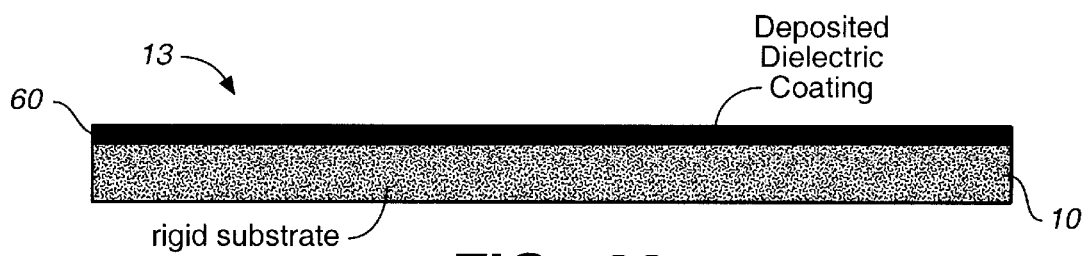
FIG._22
FIG._23
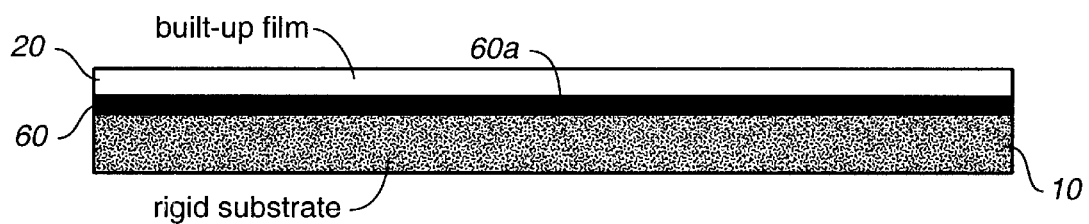
FIG._24
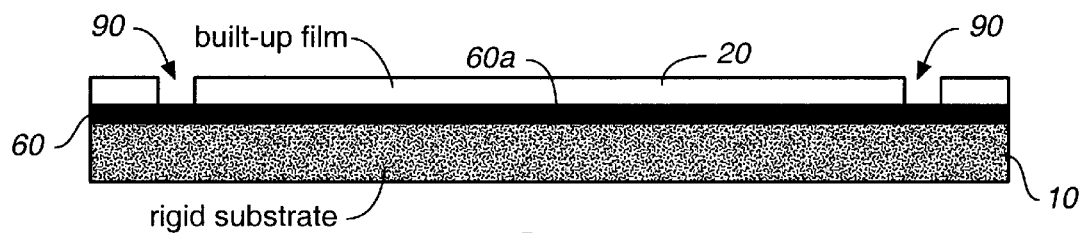
FIG._25
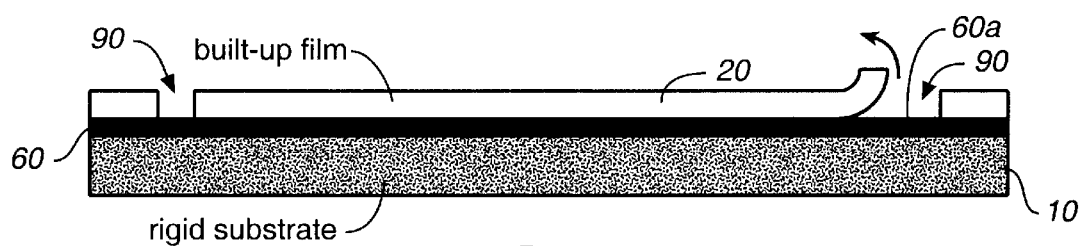
FIG._26

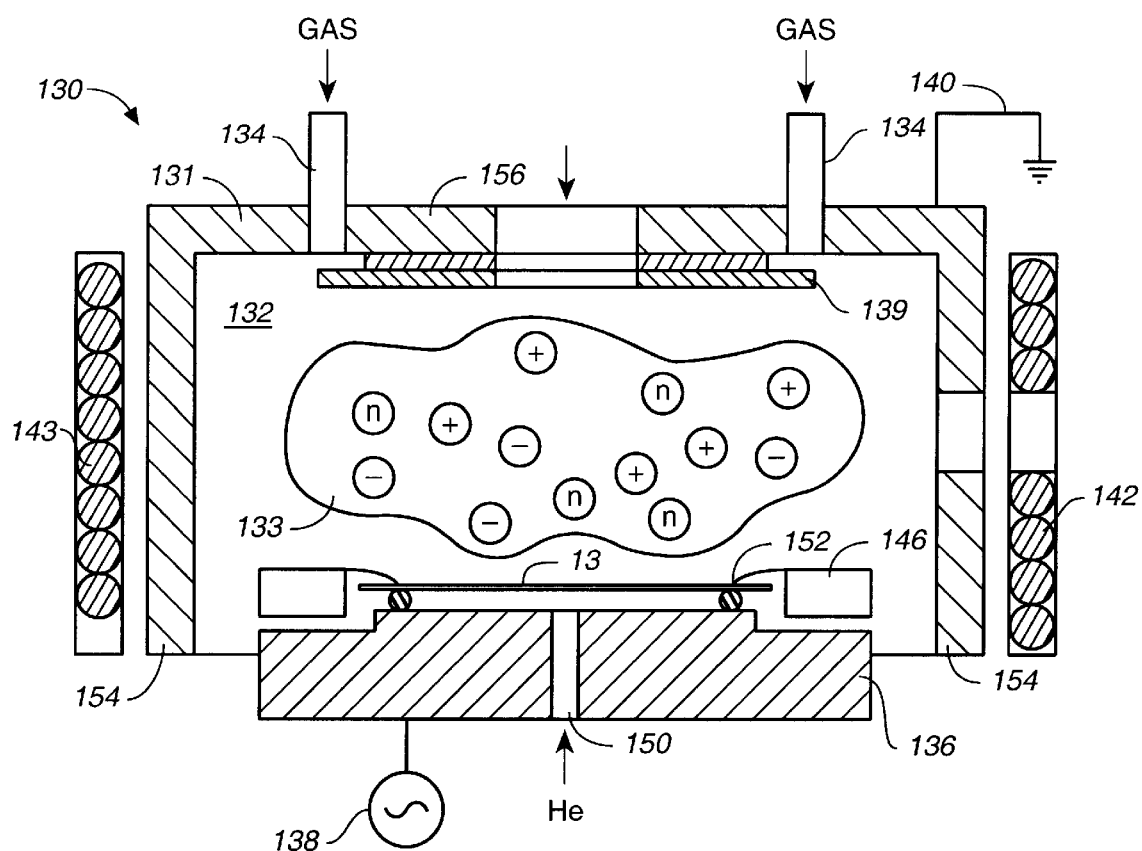
FIG._27 *(PRIOR ART)*
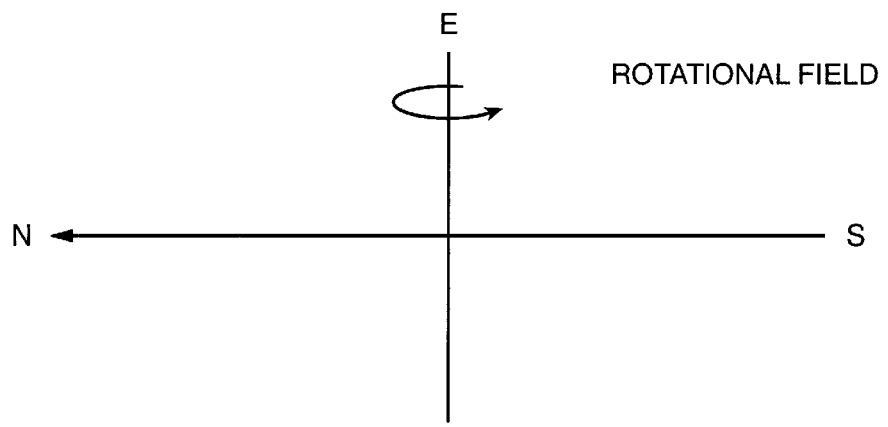
FIG._28

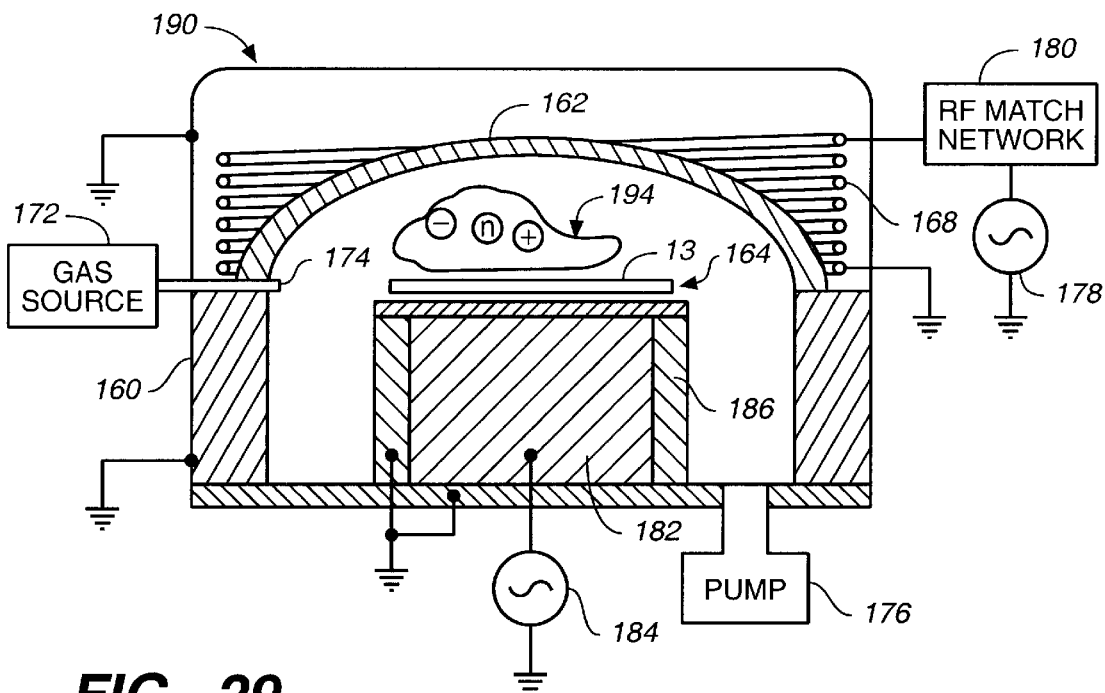
FIG._29
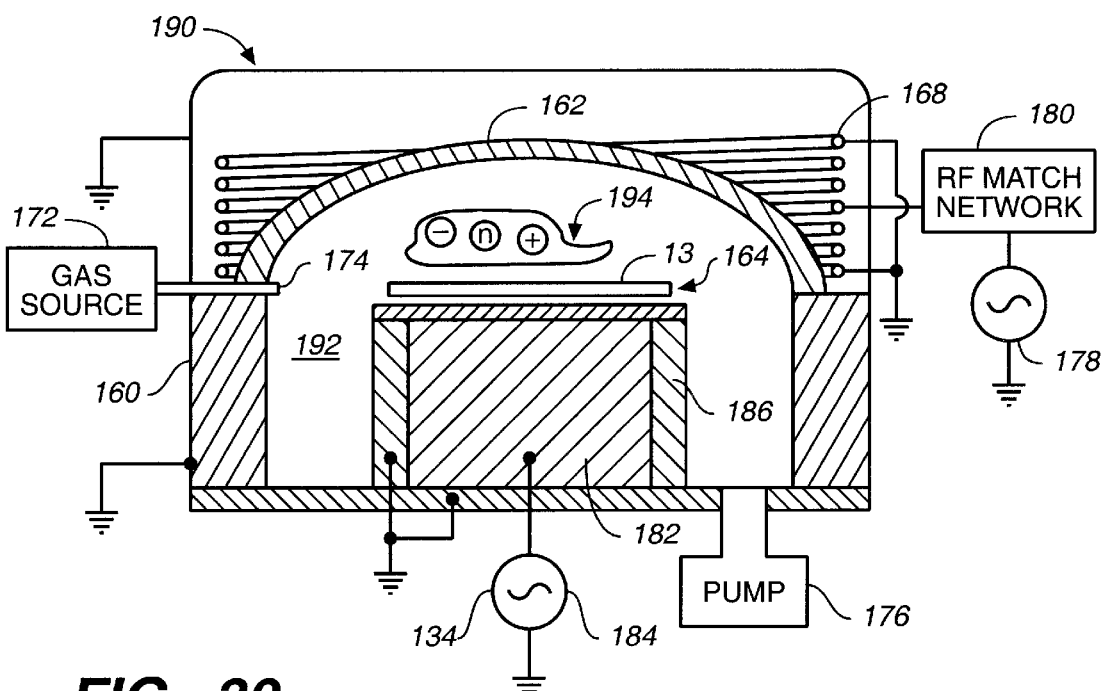
FIG._30

METHODS FOR DETACHING A LAYER FROM A SUBSTRATE

CROSS-REFERENCE TO RELATED APPLICATION

This application is a continuation-in-part application of patent application Ser. No. 09/376,645, filed Aug. 18, 1999 now U.S. Pat. No. 6,391,220. Benefit of the early filing date is claimed for all common subject matter.

FIELD OF THE INVENTION

Embodiments of the invention relate to methods and precursors used for forming flexible circuit structures.

BACKGROUND OF THE INVENTION

Circuit structures such as circuit boards have conductive lines which are used to communicate electrical components such as integrated circuit chips. Flexible circuit structures have been of particular interest in recent years, because flexible circuit structures have many advantages over rigid circuit structures. For example, flexible circuit structures typically weigh less and can occupy less space than rigid circuit structures. The reduced space and weight provided by flexible circuit structures make them especially suitable for use in lightweight and small products such as laptop computers, cellular phones, cameras, etc.

While flexible circuit structures are highly desirable, reliable flexible circuit structures having fine line circuit patterns can be difficult to form in an efficient and cost-effective manner. For example, typical flexible circuit structure precursors typically include one or more flexible dielectric films with one or more conductive patterns on the dielectric films. Forming conductive patterns on flexible dielectric films is difficult, because they are flimsy and thin. If, for example, a flexible dielectric film wrinkles during a photolithography process, a formed photoresist image on the dielectric film may be distorted. This distortion can lead to the formation of short and/or open circuits in the subsequently formed conductive pattern.

It would be desirable to provide for improved articles and methods for fabricating flexible circuit structures.

SUMMARY OF THE INVENTION

Embodiments of the invention can be used to manufacture flexible circuit structures efficiently and less expensively.

One embodiment of the invention is directed to a method comprising: depositing a release layer on a substrate; forming a conductive laminate on the release layer; and peeling at least a portion of the conductive laminate off of the substrate.

Another embodiment of the invention is directed to a method comprising: depositing a release layer on a substrate; forming a flexible conductive laminate on the release layer; cutting the conductive laminate along a line defining a portion of the conductive laminate; and separating the cut portion of the conductive laminate from the substrate.

Another embodiment of the invention is directed to an article comprising: a substrate; a conductive laminate; and a release layer disposed between the substrate and the conductive laminate, wherein the conductive laminate is flexible and is capable of being peeled off of the substrate.

The invention also provides a method for detaching a layer from a substrate comprising depositing on a substrate a first bonding material having a first bonding strength; depositing a release layer on the first bonding material; depositing on the release layer a second bonding material having a second bonding strength less than the first bonding strength; depositing a conductive layer on the second bonding material; and removing at least a portion of the conductive layer from at least a portion of the second bonding material.

The invention further also provides a method for detaching a layer from a substrate comprising depositing on a substrate a first bonding material having a first bonding strength; depositing a release layer on the first bonding material; depositing on the release layer a second bonding material having at least one first bonding section and a second bonding section. The first bonding section includes a first bonding strength which is greater than a secondary bonding strength of the second bonding section; depositing a conductive layer on the second bonding material; and removing at least a portion of the conductive layer from at least a portion of the secondary bonding section. The method additionally comprises cutting prior to the removing of at least a portion of the conductive layer, a plurality of openings through said conductive layer and said second bonding material. The first bonding section comprises a plurality of first bonding sections. The plurality of first bonding sections include at least two first bonding sections being spaced from each other. The at least one of the openings passes between the two spaced first bonding sections.

A further embodiment of the present invention provides a method for detaching a layer from a substrate comprising: depositing a first layer on a substrate; treating (e.g., with oxygen plasma) a surface of the first layer to form a treated-surface on the first layer; forming a second layer on the treated surface; and removing the second layer from the treated surface of the first layer. The first layer comprises a dielectric layer. The second layer includes a conductive layer. Moving of the second layer comprises peeling the second layer from the treated surface. The method additionally comprises exposing the first layer to a fluid selected from the group consisting of a liquid, a gas, or mixtures thereof. The fluid may be selected from the group consisting of water, steam, or mixtures thereof.

These and other embodiments of the invention are described in further detail below.

BRIEF DESCRIPTION OF THE DRAWINGS

FIGS. 1 to 5 show cross sections of articles used in the formation of flexible circuit structures;

FIG. 6 is a side elevational view of an assembly including a substrate having a release layer connected thereto by a first bonding agent and a conductive laminate connected to the release layer by a second bonding agent;

FIG. 7 is a side elevational view of the assembly of FIG. 6 additionally including a dielectric film disposed between the conductive laminate and the second bonding agent;

FIG. 8 is a side elevational view of another assembly including a substrate having a release layer connected thereto by first bonding agents, which include two portions with one portion having more bonding strength than a second portion, and with the assembly further including a conductive laminate connected to the release layer by a second bonding agent;

FIG. 9 is a side elevational view of yet another assembly including a substrate having a release layer connected thereto by a first bonding agent and a dielectric film supporting a conductive laminate and adhered to the release layer through second bonding agents having two perimetrical opposed portions, each with a greater bonding strength than an intermediate portion positioned between the two perimetrical portions;

FIG. 10 is a side elevational view of yet still another assembly including a substrate having a release layer connected thereto by first bonding agents having two perimetrical opposed pair portions, each with a greater bonding strength than a bonding strength of an intermediate portion positioned between the two perimetrical opposed pair portions, and a conductive laminate coupled to the release layer through a second bonding agent;

FIG. 11 is a side elevational view of the assembly of FIG. 9, but with the second bonding agents comprising two perimetrical opposed portions having a greater bonding strength than a bonding strength of an intermediate portion positioned between the two perimetrical portions;

FIG. 12 is a side elevational view of the assembly of FIG. 6 after a pair of openings were made in the assembly to the substrate;

FIG. 13 is a side elevational view of the assembly of FIG. 7 after a pair of openings were made in the assembly to the substrate;

FIG. 14 is a side elevational view of the assembly of FIG. 14 with the conductive laminate being peeled back;

FIG. 15 is a side elevational view of the assembly of FIG. 13 with the dielectric film and the conductive laminate in the process of being peeled back;

FIG. 16 is a side elevational view of the assembly of FIG. 14 with the release layer and conductive laminate in the process of being peeled back;

FIG. 17 is a side elevational view of the assembly of FIG. 13 with the release layer and the dielectric film and the conductive laminate in the process of being peeled back;

FIG. 18 is a side elevational view of the assembly of FIG. 10 after openings were formed on the substrate between each of the two perimetrical opposed pair portions of the first bonding agents and with the conductive laminate in the process of being peeled back;

FIG. 19 is a side elevational view of the dielectric film and conductive laminate being peeled off of another embodiment of the laminated assembly;

FIG. 20 is a side elevational view of the assembly of FIG. 8 after openings were formed on the substrate and with the conductive laminate in the process of being peeled back;

FIG. 21 is a side elevational view of the dielectric film and conductive laminate being peeled off of another embodiment of the laminated assembly;

FIG. 22 is a side elevational view of an assembly having a substrate supporting a dielectric coating or layer;

FIG. 23 is a side elevational view of the assembly of FIG. 22 after a surface of the dielectric coating or layer was treated in an oxygen plasma;

FIG. 24 is a side elevational view of the assembly of FIG. 23 after a conductive laminate has been disposed on the oxygen-plasma treated surface of the dielectric coating or layer;

FIG. 25 is a side elevational view of the assembly of FIG. 24 after openings have been made on the substrate down to the oxygen-plasma treated surface of the dielectric coating or layer;

FIG. 26 is a side elevational view of the assembly of FIG. 25 with the conductive laminate in the process of being peeled back;

FIG. 27 is a vertical sectional view of prior art plasma processing apparatus for treating a surface with oxygen plasma;

FIG. 28 is a diagram of a flux produced by a magnetic field and illustrated as rotating around a center axis;

FIG. 29 is a simplified cut-away view of an inductively coupled prior art RF plasma reactor which may be employed for treating a surface with oxygen plasma; and FIG. 30 is a simplified cut-away view of another inductively coupled prior art RF plasma reactor which may be employed for treating a surface with oxygen plasma.

DETAILED DESCRIPTION OF PREFERRED EMBODIMENTS OF THE INVENTION

In embodiments of the invention, a release layer is deposited on a substrate. During processing, the substrate supports flexible layers used to form a conductive laminate, which is in turn used to form a flexible circuit structure. A conductive laminate may then be formed and deposited on the release layer. After the conductive laminate is formed on the release layer and the substrate, at least a portion of the conductive laminate is separated from the substrate. For example, the conductive laminate or a portion of the conductive laminate is separated from the substrate by peeling it off of the substrate. In some embodiments, at least a portion of the release layer is separated along with the separated conductive laminate portion. If desired, the release layer material on the separated conductive laminate portion can be removed from the conductive laminate portion to form the flexible circuit structure.

The substrate is suitable for supporting one or more flexible conductive and dielectric layers when forming a conductive laminate. Preferably, the substrate has a major surface, which is smooth. Examples of typical substrates include plates, wafers, and disks. Typical substrates may include any suitable material including a rigid ceramic (e.g., aluminum oxide ($Al_2O_3$), polymeric, or metallic material. Suitable substrate materials include aluminum nitride, silicon, quartz, glass, and aluminum including aluminum oxide. Moreover, the substrate can be a monolithic body or can be a composite having two or more layers. For example, the substrate can comprise a wafer (e.g., a ceramic wafer) having a thin layer of metal (e.g., aluminum) or oxide (e.g., silica) on the wafer. In other embodiments, the substrate can comprise a monolithic body such as a metal plate or a metal wafer. The substrate is also preferably capable of being easily transported to one or more processing tools.

With reference to FIG. 1, the release layer 11 is deposited on a substrate 10 in any suitable manner. For example, the release layer 11 can be coated or laminated on the substrate 10. Suitable coating processes include spin coating, dip coating, curtain coating, doctor blade coating, and roller coating. The deposited release layer 11 can have any suitable thickness including a thickness of less than about 10 microns. The thickness of the release layer 11 is preferably between about 2 and about 10 microns. Stated alternatively, the thickness of the release layer 11 ranges from about 50 Ångstroms to about 300 Ångstroms, preferably from about 100 Ångstroms to about 2,000 Ångstroms, more preferably from about 150 Ångstroms to about 1,500 Ångstroms.

The release layer 11 is disposed between the conductive laminate 20 and the substrate 10. The release layer 11 is preferably in direct contact with the substrate 10 and facilitates easy separation of the conductive laminate 20 from the substrate 10. For example, in some embodiments, a portion of the conductive laminate can be peeled off of the substrate 10 (e.g., by hand) without damaging the separated conductive laminate portion. In this regard, the release layer 11 preferably has a shear strength such that it does not tear or leave a portion on the conductive laminate 20 or on the substrate 10 when peeling takes place.

The peelable interface can be present at either surface of the release layer 11. For example, the peelable interface can be between the release layer 11 and the substrate 10. During peeling, a portion of the release layer 11 can be simultaneously peeled off of the substrate 10 along with the peeled conductive laminate. In another example, the peelable interface can be between the release layer 11, and a barrier layer or conductive laminate 20 in direct contact with the release layer 11. In these embodiments, the release layer 11 can remain on the substrate 10 after the conductive laminate 20 is peeled off of the substrate 10. The peel strength between the release layer 11 and another structure (e.g., the substrate 10) in direct contact with the release layer 11 may be less than about 30 g/cm (e.g, at 90° C.).

The peel strength can be modified by modifying the properties of the release layer. For example, in some embodiments, the adhesive properties of the release layer 11 can be modified by introducing the release layer 11 to a humid environment. For example, a polyimide release layer disposed on a glass substrate may be exposed to an environment having a humidity of greater than about 80%. After curing, for example, a polyimide/glass substrate combination can be put in a high-humidity, high-pressure chamber for about 30 minutes or more. It is believed that the absorption of water into the release layer can reduce the adhesion between the glass substrate and the polyimide release layer so that the subsequent separation of the conductive laminate from the substrate is less difficult. In other embodiments, the properties of the deposited and cured release layer need not be modified. For instance, polyimide release layers on quartz substrates typically need not be modified as polyimide release layers are normally easily peelable from quartz substrates.

The release layer 11 can include any suitable material. For example, the release layer 11 may include a polymeric material. Suitable examples of polymeric materials include polyimides (e.g., DuPont PI 2611), fluoropolymers such as fluorinated poly(arylethers), benzocyclobutenes (e.g, Cyclotene™ from Dow Chemical), polyphenylquinoxalines (PPQ), polynorborenes (e.g., Avatrel™ from BF Goodrich), liquid crystal polymers, and silicon containing polymers such as polysiloxanes. The release layer 11 may also be a metal, such as a metal (e.g., chromium (Cr), molybdenum (Mo), and tungsten (W)) selected from group VIB of the periodic table according to Mendeleef. Preferably, the release layer 11 may be a noble metal selected from the group consisting of gold (Au), silver (Ag), platinum (Pt), palladium (Pd), iridium (Ir), rhodium (Rh), mercury (Hg), ruthenium (Ru) and osmium (Os). More preferably, the metal may be gold (Au), palladium (Pd) and platinum (Pt). Thus, the release layer 11 represents a layer of a group VIB metal or a noble metal, or a multilayer metal where the multilayer metal is two or more metals selected from the group VIB metal or the noble metal group.

After the release layer 11 is deposited on the substrate 10, the release layer 11 may be cured. Any suitable curing temperature may be used. For example, the deposited release layer 11 may be heated to a temperature of at least about 300° C. to cure the release layer. Preferred curing temperatures can be between about 350° C. to about 375° C. Curing or heating the release layer can be desirable if, for example, the deposited release layer 11 needs to be further solidified after being deposited on the substrate 10.

In some embodiments, a bonding material (identified as "45" below) such as an adhesive or coupling agent (e.g., a silane coupling agent) can be deposited on the substrate 10 prior to depositing the release layer 11 on the substrate 10. The bonding material can be applied in a predetermined configuration on the substrate so that the portions of the release layer 11 contacted by the bonding material are tightly bonded to the surface of the substrate 10. The tightly bonded portions of the release layer 11 may serve as a frame to hold the less tightly bonded regions of the release layer 11 against the substrate surface. By using a bonding material to secure the release layer 11 to the substrate 10, a wider variety of substrate and release layer materials can be used to form flexible printed circuit structures.

In an illustrative method using the bonding material, the bonding material is applied to the substrate surface in a pattern generally corresponding to the regions of the conductive laminate 20 to be cut. For example, the peripheral regions of the substrate surface can be coated with a continuous or discontinuous line of bonding material prior to depositing the release layer 11. After depositing the release layer 11, the release layer 11 contacts the bonding material and is tightly secured to the peripheral regions of the substrate 10 via the bonding material. As the conductive laminate 20 is adhered to the release layer (e.g., via a barrier layer), the subsequently formed conductive laminate 20 is also tightly secured to the peripheral regions of the substrate 10. Portions of the release layer 11 and the conductive laminate 20 disposed inwardly from the peripheral regions can be less tightly secured (e.g., unsecured) to the surface of the substrate 10. After the conductive laminate 20 is formed on, and is adhered to, the release layer 11, the conductive laminate 20 can be cut at regions inwardly from and proximate to the tightly secured regions of the release layer 11. The less tightly secured, cut conductive laminate portion can then be physically detached from the portions of the conductive laminate 20 which are tightly secured to the substrate 10, and then separated from the substrate 10 (e.g., by peeling).

With reference to FIG. 2, a barrier layer 12 can be optionally deposited on the release layer 11 and substrate 10, after the release layer 11 is deposited on the substrate 10. As shown in FIG. 2, the release layer 11 is disposed between, and may be in direct contact with, both the substrate 10 and the barrier layer 12. Preferably, the barrier layer 12 is a continuous layer which is substantially coextensive with the adjacent release layer 11. The barrier layer 12 can be used to help adhere the conductive laminate 20 to the release layer 11 and/or can be used as a seed layer to initiate the formation a subsequently formed conductive laminate 20.

As will be described in further detail below, the barrier layer 12 can also be used to protect the separated conductive laminate 20 or portion thereof during the removal of any release layer material attached it. After any attached release layer material is removed, the barrier layer 12 can remain as part of the subsequently formed flexible circuit structure or may be removed (e.g., by etching). Alternatively, if the barrier layer 12 is conductive, a conductive pattern may be formed from the barrier layer 12 (e.g., by using photolithography), and can constitute part of the flexible circuit structure. In such embodiments, circuit patterns can be formed on both sides of a flexible circuit structure in an efficient manner.

The barrier layer 12 can be deposited on the release layer 11 in any suitable manner. For example, the barrier layer 12 can be laminated to the release layer 11. Alternatively, a barrier layer material can be coated on the release layer 11 by a coating process such as sputtering or vapor deposition. The deposited barrier layer 12 can have any suitable thickness including a thickness of about 300 angstroms (e.g., 400 angstroms) or more. While the barrier layer 12 may comprise any suitable material, including a dielectric or a conductive metal, the barrier layer 12 preferably comprises a metal such as Cr, Cu, Ag, Au, etc. The barrier layer may be in the form of a single layer or can be comprised of multiple sublayers. In some embodiments, one sublayer can be used as an adhesion layer and another sublayer can be used as a seed layer. For example, the barrier layer 12 may include an adhesion sublayer of chromium (e.g., at least about 400 angstroms thick) and a seed sublayer of copper (e.g., at least about 4000 angstroms thick).

While the embodiments described with reference to FIGS. 1 to 5 describe the use of a barrier layer 12 between the release layer 11 and the conductive laminate 20, the barrier layer 12 need not be used. For example, in some embodiments, the conductive laminate 20 may be formed directly on the release layer 11 and portions of the conductive laminate 20 may be separated from the substrate 10 to form a flexible circuit structure. These embodiments can be used to form a flexible circuit structure having a conductive pattern on one side.

With reference to FIG. 3, after depositing the release layer 11 or the barrier layer 12, a conductive laminate 20 is formed on the release layer 11. The conductive laminate 20 typically includes one or more flexible dielectric layers (identified as "60" below) and one or more patterned conductive layers. Any suitable process including additive, subtractive, or semi-additive processes can be used to form the conductive laminate 20. Preferably, the conductive patterns in the conductive laminate 20 are formed by electroplating, and the dielectric layers are formed by coating (e.g., spin coating) and then curing a dielectric material (e.g., polyimide). If electroplating is used, the barrier layer 12 or a portion thereof can be used as a seed layer for a subsequent build up of conductive structures such as conductive via structures in the conductive laminate 20. The conductive and insulating layers in the conductive laminate 20 typically have a thickness of about 25 microns or less.

After forming the conductive laminate 20, the conductive laminate 20 can be cut so that the cut portion of the conductive laminate 20 can be separated from the substrate 10. The conductive laminate 20, the release layer 11 and the barrier layer 12 can be cut by using any suitable process. For example, one or more of these layers or structures can be cut with a laser or a blade such as a saw, knife or razor blade. In other embodiments, the conductive laminate 20 need not be cut. For example, the conductive laminate 20 can be peeled off of the substrate 10 without cutting the conductive laminate 20.

The conductive laminate 20 can be cut along lines which define the predetermined conductive laminate portions to be removed. The release layer 11 and, if present, the barrier layer 12, can be cut along with the conductive laminate 20. For example, as shown in FIG. 4, the conductive laminate 20, the release layer 11, and the barrier layer 12 can be cut at a region inwardly from the periphery of the substrate 10 so that a corresponding conductive laminate portion 20 can be separated. In some embodiments, the conductive laminate 20 may be cut according to a pattern which corresponds to portions of the conductive laminate 20 to be peeled. In these embodiments, plural distinct conductive laminate portions are formed. For example, the conductive laminate 20 may comprise an array of flexible circuit structures. The conductive laminate 20, the release layer 11, and the barrier layer 12 can be diced or cut along lines separating individual flexible circuit structures in the array so that the individual circuit structures can be separated from each other and from the substrate 10.

After cutting the conductive laminate 20, the cut conductive laminate portion 30 is separated from the substrate 10. Preferably, the cut conductive laminate portions 30 are separated from the substrate 10 by peeling. As shown in FIG. 4, co-extensive cut portions of the conductive laminate 20, the barrier layer 12, and the release layer 11 can be simultaneously peeled off of the substrate 10. The cut conductive laminate portion 30 can be peeled by hand or with any suitable apparatus.

After separating the conductive laminate portion 30 from the substrate 10, the release layer material separated along with the conductive laminate portion can be removed. Release layer material attached to the conductive laminate portion 30 can be removed using any suitable process. For example, the release layer material can be removed by an etching process such as plasma etching or wet chemical etching. Preferably, the release layer material is removed by plasma etching. In a typical plasma etching process, the reaction chamber pressure can be about 150 to 300 mT, the ionizable gas flow rate (e.g., oxygen) can be about 50 to 150 sccm (standard cubic centimeters), and the power can be about 200 to 450 Watts.

During the removal of the release layer material, the barrier layer 12 can be used to protect the conductive laminate portion 30. For example, the barrier layer material can be resistant to a medium used for etching the release layer material. When the release layer material on the conductive laminate portion 30 is being etched, the barrier layer 12 covers the conductive laminate portion, thus protecting it from the etching medium. Consequently, the release layer material can be removed, without etching the conductive laminate portion.

After the release layer material is removed, the barrier layer portion removed along with the release layer 11 can remain on the conductive laminate portion 30 or can be removed from the conductive laminate portion 30. Any suitable process including etching can be used to remove the barrier layer material. In other embodiments, the barrier layer 12 or portion thereof can be patterned. Any suitable process including photolithography and laser ablation can be used to form a conductive pattern from the barrier layer 12 or barrier layer portion.

The subsequently formed flexible circuit structure 40 can have any suitable dimensions. For example, the formed flexible circuit structure can have a thickness between about 3 and about 100 microns, and preferably between about 10 and about 50 microns. The planar dimensions of the flexible circuit structure can vary depending upon the application intended. For example, the flexible circuit structure can have planar dimensions larger than the planar dimensions of one chip or many coplanar chips so that the chips can be disposed on the flexible circuit structure. In other embodiments, the flexible circuit structures may be used as electrical connectors between, e.g., two circuit boards.

Referring now to FIGS. 6–19 for another embodiment of the present invention, there is seen in FIG. 6 the substrate 10, the release layer 11 secured to the substrate 10 by bonding material 45 and the conductive laminate 20 (e.g., build-up film) is secured to the release layer 11 by bonding material 50. In the embodiment of the invention in FIG. 7 a dielectric film 60 is disposed between the conductive laminate 20 and the bonding material 50. Thus, in FIG. 7, dielectric film 60 is secured to the release layer 11 by bonding material 50, and laminatedly supports the conductive laminate 20. In the embodiment of the invention in FIG. 8, the bonding material 45 has two parts, bonding material sections 45a—45a and bonding material section 45b. Bonding material sections 45a—45a and bonding material section 45b have different bonding strengths. Thus, bonding material sections 45a—45a may have a stronger bonding or adhesive characteristic than bonding material section 45b, or vice versa. Preferably, bonding material sections 45a—45a are stronger than bonding material section 45b such that conductive laminate 20 (or dielectric film 60 supporting conductive laminate 20) may be readily peeled back (see FIGS. 18 and 19) and off of release layer 11 without release layer 11 being disturbed.

Alternatively, as best shown in FIG. 9, bonding material 50 may have two parts, bonding material sections 50a—50a and bonding material section 50b, similarly to bonding material 45 having bonding material sections 45a—45a and 45b. As was seen for bonding material sections 45a—45a and 45b, bonding material sections 50a—50a and bonding material section 50b have different bonding strengths. Thus, bonding material sections 50a—50a may have a stronger bonding or adhesive characteristic than bonding material section 50b or vice versa. Preferably, bonding material sections 50a—50a are stronger than bonding material section 50b such that after etching conductive laminate 20 (or dielectric film 60 supporting conductive laminate 20) between the opposed bonding material sections 50a—50a and immediately above bonding material section 50b may be readily peeled back and removed and off of release layer 11 without release layer 11 being disturbed.

In FIG. 10 bonding material section 45 comprises bonding material sections $45a_1$, $45a_2$, $45a_3$, $45a_4$ and 45b. Bonding material sections $45a_1$, and $45a_4$ are respectively spaced from, discontinuous from, or disconnect from bonding material sections $45a_2$ and $45a_3$. Thus, bonding material sections $45a_1$, $45a_2$, $45a_3$ and $45a_4$ represent an array which surrounds weakly adhesive region (e.g., bonding material section 45b). Similarly, as shown in FIG. 1, bonding material section 50 may include bonding material sections $50a_1$, $50a_2$, $50a_3$, $50a_4$ and 50b. As was indicated for bonding material sections $45a_1$, $45a_2$, $45a_3$ and $45a_4$, bonding material sections 50a, and $50a_4$ are respectively spaced from, discontinuous from, or disconnect from bonding material sections $50a_2$ and $50a_4$. Thus, bonding material sections $50a_1$, $50a_2$, $50a_3$ and $50a_4$ represent an array which surrounds a weakly adhesive region (e.g., bonding material section 50b).

After the laminated structures of FIGS. 6–11 have been formulated, the conductive laminate 20 is patterned to produce openings 80a and 80b by etching, cutting, laser ablation, or by any other suitable means. In FIGS. 18 and 19 openings 80a and 80b respectively pass between bonding material sections $45a_1$, $45a_2$ and bonding material section $45a_3$ and $45a_4$. Alternatively, while not being shown in the drawings, openings 80a and 80b may bifurcate or split opposed bonding material sections 45a—45a and/or opposed bonding material sections 50a—50a.

Bonding materials 45 (including section 45b) and 50 (including section 50b) may be any suitable bonding material that is capable of accomplishing the purposes for bonding materials 45 and 50. Suitable materials for bonding materials 45 and 50 have been discovered to be materials comprising the compound $Si_nH_{2n+2}$ wherein n is an integer ranging from 1 to 5, or materials comprising any other suitable organo-functional silanes which has the ability to bond organic polymer systems to inorganic substrates, such as hexamethyldisilazane (HMDS). The amount of $Si_nH_{2n+2}$ in the bonding materials affects the relative bonding strength, well known to those skill in the art. Preferably, the peel strength of the materials for these bonding materials ranges from about 0.005 gms./cm. to about 5.0 gms./cm., more preferably from about 0.01 gms./cm. to about 3.0 gms./cm., and most preferably from about 0.1 gms./cm. to about 2.0 gms./cm.

Bonding material sections 45a—45a (including sections $45a_1$, $45a_2$, $45a_3$ and $45a_4$) and bonding material sections 50a—50a (including sections $50a_1$, $50a_2$, $50a_3$ and $50a_4$) may be any suitable, preferably strongly adhesive (i.e., stronger than adhesive sections 45, 45b, 50 and 50b) that is capable of accomplishing the purposes for bonding material sections 45a (including $45a_1$, $45a_2$, $45a_3$ and $45a_4$) and bonding material sections 50a (including sections $50a_1$, $50a_2$, $50a_3$ and $50a_4$). Suitable materials for bonding material sections 45a including $45a_{1-4}$ and bonding material section 50a including $50a_{1-4}$ have been discovered to be hexamethyldisilazane (HMDS), as previously indicated. Preferably, the peel strength for these bonding material sections ranges from about 0.005 gms./cm. to about 5.0 gms./cm., more preferably from about 0.01 gms./cm. to about 3.0 gms./cm., and most preferably from about 0.1 gms./cm. to about 2.0 gms./cm.

As previously indicated, after cutting, etching, or the like, slots or openings 80a and 80b inwardly of the periphery part of the portion of the laminated structure between openings 80a and 80b is removed. In FIGS. 14, 18 and 20 and FIGS. 15, 19 and 21 conductive laminate 20 and dielectric film 60/conductive laminate 20 are removed (e.g., peeled, pulled, wedged or sheared off by mechanical means) respectively from the release layer 11 by breaking or severing the bonding material 50 between the conductive laminate 20 and the release layer 11 and between the dielectric film 60 and the release layer 11, respectively. In FIGS. 16 and 17 release layer 11/conductive laminate 20 and release layer 11/dielectric film 60/conductive laminate 20 are removed respectively from substrate 10 by severing or ripping the bonding material 50 between the release layer 11 and substrate 10.

Thus, by the practice of the embodiments of the invention of FIGS. 6–21 there is provided circuit structures and methods for making detachable circuits comprising dielectric films for multiple circuit module (MCM) substrate or single circuit module (SCM) substrate. As indicated, the method utilizes metallic thin films (e.g., conductive laminate 20) or a single film (e.g., release layer 11 or dielectric film 60) with weak adhesion, such as bonding material 50 (including bonding material section 50b) and bonding material 45 (including bonding material section 45b) with weak adhesion to either the substrate 10 (which may be either flexible or rigid) or the dielectric film 60. The rigid or flexible substrate 10 is coated with a weakly adhesive, such as bonding material 45, whereupon release layer 11 is placed. Subsequently, another weakly adhesive, such as bonding material 50, is disposed on the release layer 11. An electric circuit comprising a metallic layer (e.g., conductive laminate 20 that may consist of one or more metallic thin films) or the dielectric film 60, or the dielectric film 60/metallic layer, may be built on top of the release layer 11. When this circuit buildup is complete, the weakly adhesive is exposed or the dielectric film is cut to expose the weakly adhesive (mechanically, chemically, by lasing, etc. The built-up circuit is peeled, pulled, wedged, or sheared off by mechanical means, thus releasing the film from the substrate 10.

The weakly adhesive, as previously indicated, may be either continuous or multiple-disconnected in nature. It preferably provides sufficient adhesion of the build-up circuit films during their manufacture. It may be used in conjunction with metallic (or non-metallic) layers (or surfaces) that provide strong adhesion. For example, the periphery of the entire substrate may be coated (or treated) with a strongly adhesive layer (or surface) and/or adhesion promoters such as HMDS in order to ensure film adhesion at the periphery during build-up. Cutting the film away from the strongly adhesive regions and inside the weakly adhesive regions then allows film removal within the weakly adhesive regions by peeling. Alternatively, an array of small outlines made with strongly adhesive regions may surround weakly adhesive regions and each of the smaller regions may be cut and peeled in the manner described above. The weakly metallic layer preferably does not undesirably interact with the dielectric film 60 build up.

Weakly adhesive metallic layers which are capable of being weakly bonded include 200 Å, 500 Å and 1000 Å Au, Pd and Pt sputtered and evaporated films on both glass and ceramic substrates (e.g., AlN) upon which polyimide built-up circuit films may be fabricated. Silicon wafers with native oxide and silicon nitride surfaces may also be employed. In these instances, the films peel at the Au/substrate interface with peel strengths less than 4 g/mm. The thin films of Au, etc. may then be etched off prior to the next processing or assembly step. Alternatively, a multilayer weakly adhesive metallic layer of 200 Å W or Mo followed with 500 Å Au results in disadhesion at the Au/polyimide interface with peel strengths less than 5 g/mm. It has been discovered that adhesive strengths in excess of about 7 grams/cm will result in unacceptable dimensional changes of the film.

In another embodiment of the present invention it has been discovered that oxygen plasma treatments of metal oxide coatings, preferably spin-on-$SiO_2$ coatings deposited upon a ceramic substrate, preferably aluminum nitride, results in low peel strengths layers, which enables an easy, reliable and cost effective method of preparing detachable dielectric film. Peel strengths in excess of about 10 grams/cm may damage any associated circuit film. It has been discovered that without oxygen plasma treatment of the metal oxide coating on the ceramic, the release layer 11 (e.g., a polymeric layer, such as a polyimide layer of a polyimide layer sold under the trade name of Dupont PI 2611) has a peel strength of about 30 g/cm., regardless of whether the release layer 11 is peeled in atmospheric conditions (e.g., in air) or peeled after exposure to moisture or water (e.g., after PCT (high pressure steam) conditions).

An open structure of a release layer 11 (e.g., a Dupont PI 2611 polyimide layer) is one in which moisture or water diffusion may readily take place through the structure or thickness of the release layer 11. In atmospheric conditions (e.g., in air), peel strengths of from about 3 g/cm to about 5 g/cm (e.g., about 3.5 g/cm) for a thin single release layer (e.g., a 10 μm polyimide single layer) depositions were found and no cracking or damage to the dielectric film (e.g., dielectric film 60 such as a $SiO_2$ film). It has been discovered that this peel strength value is essentially the same peel strength values for noble metal (e.g., Au) sputtered films. After exposure to water or moisture, such a high pressure steam, films are detachable, preferably being self-detachable or removed in the water or moisture environment.

A closed structure of a release layer 11 (e.g., a Dupont 2611 polyimide layer) is one in which moisture or water cannot readily diffuse therethrough. It has been discovered that if the release layer 11 is blanket coated with sputtered chromium (e.g., a 400 Å layer of chromium and/or copper (e.g., a 4,000 Å layer of copper, or Cr(400 Å)/Cu(4,000 Å) layers) moisture or water cannot get to release layer 11/substrate 10 interface, and peel strengths are greater when peeling is attempted in air. For example, it has been discovered that for a AlN substrate, laden with a PI release layer supporting a 4,000 Å copper layer superimposed with a 400 Å chromium layer, the peel strengths ranged from about 40 gram/cm to about 60 grams/cm. It has been further discovered that peeling the foregoing laminated structure in moisture or water, or after PCT, or with $O_2$ plasma treatment, had no substantial effect upon the values of the peel strengths. However, it has been discovered that for blanket chromium/copper (e.g., 400 Å chromium/4,000 Å copper) coated PI (release layer) a supported by spin-on-$SiO_2$ upon AlN substrate, the peel strengths were dramatically altered in accordance with $O_2$ plasma treatment and/or moisture or water exposure. It has been discovered that the peel strength for the release layer 11 was reduced to from about 20 gm/cm to about 40 gm/cm for $O_2$ plasma treated spin-on-$SiO_2$ surface. It has been further discovered that when the Cr/Cu/PI/$SiO_2$/AlN structure was peeled in moisture or water without $O_2$ plasma treatment, the peel strength ranged from about 4 g/cm to about 7 g/cm, and when the same structure was peeled in moisture or water after $O_2$ plasma treatment, the peel strength was reduced to a value ranging from about 1 gm/cm to about 3 gm/cm. It is believed that when $O_2$ plasma comes in contact with the top surface of the $SiO_2$, the top surface of the $SiO_2$ is converted or altered to a surface that weakly adheres to a cured release layer 11 (i.e., a cured PI layer), and the interfacial adhesion is reduced by absorbable species (e.g., water, hydroxide ions, etc.) that may be absorbed at the release (PI) layer/dielectric ($SiO_2$) plasma treated interface in order to weaken same to produce lower peel strengths.

Referring now to FIGS. 22–30 there is seen a structure 13 including a substrate 10, which may be rigid or flexible. Dielectric film 60 is coated on or deposited on the substrate 10 such as to be weakly adhered thereto. As indicated previously, dielectric film 60 may include two or more dielectrics, or two or more dielectric films. As is well known in the art, the dielectric film 60 may be deposited mechanically, chemically, or by vapor assisted processing. It may be deposited as a precursor to subsequent bulk or surface conversion processing including thermal, mechanical, chemical, plasma, vacuum, radiative, optical, or electro-magnetic treatments. Preferably, the dielectric film 60 is surface treated in or by plasma in order to form a surface 60a having weakly adhesive properties.

The plasma for treating the dielectric film 60 to produce surface 60a having weakly adhesive properties may be any suitable plasma, having a low density or a high density. High density plasma may be defined as a plasma of a surface treating gas having an ion density greater than about $10^9/cm^3$, preferably greater than about $10^{11}/cm^3$. Thus, low density plasma may be defined as a plasma of a surface treating gas having an ion density of less than about $10^{11}/cm^3$, preferably less than about $10^9/cm^3$.

The plasma may be produced by any suitable plasma processing apparatus. A suitable plasma processing apparatus is shown in FIG. 27 and described in U.S. Pat. No. 5,188,704 to Babie et al., fully incorporated herein by reference thereto as if repeated verbatim immediately hereinafter. The plasma process apparatus of FIG. 27 comprises a plasma reactor, generally illustrated as 130 and including walls, generally illustrated as 131 for forming and housing a reactor chamber 132 wherein a plasma 133 of netural (n) particles, positive (+) particles and negative (−) particles are found. Walls 131 include cylindrical wall 154 and cover 156.

Plasma processing gases are introduced via inlets 134 into reactor chamber 132. A water cooled cathode 136 is connected to an RF power supply 138 at 13.56 MHz. An anode 139 is connected to the walls 131 which are grounded by line 140. Helium gas is supplied through passageway 150 through cathode 136 to the space beneath the structure 13 which is supported peripherally by lip seal 152 so that the helium gas cools the structure 13. The structure 13 is supported by a support 146 that includes a plurality of clamps (not shown) which hold down the upper surface of structure 13 at its periphery, as is well known to those skilled in the art. A part of helmholtz configured electromagnetic coils 142 and 143 provide a transverse magnetic field with the north and south poles at the left and right providing a horizontal magnetic field axis parallel to the surface of the structure 13. The transverse magnetic field is applied to slow the vertical velocity of the electrons which are accelerated radially by the magnetic field as they move towards the structure 13. Accordingly, the quantity of electrons in the plasma 133 is increased by means of the transverse magnetic field and the plasma 133 is enhanced as is well known to these skilled in the art.

The electromagnetic coils 142 and 143 which provide the magnetic field are independently controlled to produce a field intensity orientation which is uniform. The field can be stepped angularly around the structure 13 by rotating the energization of the electromagnetic coils 142 and 143, sequentially. The transverse magnetic field provided by the electromagnetic coils 142 and 143 is directed parallel to the surface of the structure 13 (i.e., surface of the dielectric film 60) being treated by the plasma 133, and the cathode 136 and to increase the ion current flux present on the surface of the structure 13, thereby permitting higher rates of etching without requiring higher ion energies to achieve the result otherwise.

The preferred magnetic source employed to achieve magnetically enhanced reactive ion etcher (RIE) used in practicing the present invention is a variable rotational field provided by the electromagnetic coils 142 and 143 arranged in a Helmholtz configuration. The electromagnetic coils 142 and 143 are driven by 3-phase AC currents. The magnetic field with Flux B is parallel to the structure 13 and perpendicular to the electrical field as shown in FIG. 28. Referring to FIG. 28 the vector of the magnetic field H which produces flux B is rotating around the center axis of the electrical field by varying the phases of current flowing through the electromagnetic coils 142 and 143 at a typical rotational frequency of 0.01 to 1 Hz, particularly at 0.5 Hz. The strength of the magnetic flux B typically varies from 0 Gauss to about 150 Gauss and is determined by quantities of the currents supplied to the electromagnetic coils 142 and 143. While FIG. 27 illustrates one plasma processing apparatus that is suitable for producing a plasma for treating the surface of the dielectric film 60, it is to be understood that other reactive ion producers may be employed, such as electron cyclotron resonance (ECR), helicon resonance or inductively coupled plasma (ICP), triode etchers, etc. Therefore, the source of the plasma may be any suitable source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The plasma may be preferably produced or provided by inductively coupling a plasma in a decoupled plasma source etch chamber, such as that sold under the trademark DPS™ owned by Applied Materials, Inc. which decouples or separates the ion flux to the structure 13 of FIG. 22 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e., an inductive source) determines the ion flux. This second rf source is not capacitive (i.e., it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the structure 13 in the chamber, such as the DPS™ brand chamber.

DPS™ brand chambers for producing the plasma for treating the surface of the delectric film 60 may be any of the DPS™ brand chambers of the inductively coupled plasma reactor disclosed in U.S. Pat. No. 5,753,044, entitled "RF PLASMA REACTOR WITH HYBRID CONDUCTOR AND MULTI-RADIUS DOME CEILING" and assigned to the Applied Materials, Inc. and fully incorporated herein by reference thereto as if repeated verbatim immediately hereinafter. Referring now to FIGS. 29 and 30 for two (2) embodiments of an inductively coupled plasma reactor from U.S. Pat. No. 5,153,044 there is seen an inductively coupled RF plasma reactor generally illustrated as 190, having a reactor chamber, generally illustrated as 192, wherein a plasma 194 of neutral (b) particles, positive (+) particles, and negative (−) particles are found. The reactor chamber 192 has a grounded conductive cylindrical sidewall 160 and a dielectric ceiling 162. The inductively coupled RF plasma reactor 190 further comprises a pedestal 164 for supporting the structure 13 in the center of the chamber 192, a cylindrical inductor coil 168 surrounding an upper portion of the chamber 192 beginning near the plan of the top of the structure 13 or pedestal 164 and extending upwardly therefrom toward the top of the chambers 192, a treating gas source 172 and gas inlet 174 for furnishing a treating gas into the interior of the chamber 192, and a pump 176 for controlling the pressure in the chamber 192. The coil inductor 168 is energized by a plasma source power supply or RF generator 178 through a conventional active RF match network 180, the top winding of the coil inductor 168 being "hot" and the bottom winding being grounded. The pedestal 164 includes an interior conductive portion 182 connected to the bias RF power supply or generator 184 and an exterior grounded conductor 186 (insulated from the interior conductive portion 182). Thus, the plasma source power applied to the coil inductor 168 by the RF generator 178 and the DC bias RF power applied to the pedestal 164 by generator 184 are separately controlled RF supplies. Separating the bias and source power supplies facilitates independent control of ion density and ion energy, in accordance with well-known techniques. To produce plasma 194 as an inductively coupled plasma, the coil inductor 168 provides the RF power which ignites and sustains the high ion density of the plasma 194. The geometry of the coil inductor 168 can in large part determine spatial distribution of the plasma ion density of the plasma 194 within the reactor chamber 192.

Uniformity of the plasma density spatial distribution of the plasma 194 across the structure 13 is improved (relative to conical or hemispherical ceilings) by shaping the ceiling 162 in a multi-radius dome and individually determining or adjusting each one of the multiple radii of the ceiling 162. The multiple-radius dome shape in the particular embodiment of FIG. 29 somewhat flattens the curvature of the ceiling 162 around the center portion of the ceiling 162, the peripheral portion of the ceiling 162 having a steeper curvature.

The plasma 133 in FIG. 27 or plasma 194 in FIGS. 29 and 30 may employ any suitable treating gas, which may partially depend on the consistency of the dielectric film(s) 60 and/or of the surface of the conductive laminate 20 coming in contact with the dielectric film(s) 60. By way of example only, if the dielectric film 60 contains silicon oxide, suitable treating gas(es) may be selected from the group consisting of fluorine-containing gases (e.g., $CHF_3$, $SF_6$, $C_2F_6$, $NF_3$, etc.), bromine-containing gases (e.g., HBr, etc.), chlorine-containing gases (e.g., $CHCl_3$, etc.), rare gases (e.g., argon, etc.) and mixtures thereof. Preferably, the etchant includes an oxidant, such as oxygen, more preferably, the treating gas from which the plasma emanates is oxygen, especially if the dielectric film(s) 60 comprises or consists of silicon dioxide ($SiO_2$).

Reactor conditions for a suitable plasma processing apparatus (such as the plasma processing apparatus of FIG. 27) for treating the surface of the dielectric film(s) 60 are as follows:

| | |
|---|---|
| Pressure | 10–250 mTorr |
| RF Power | 200–1500 watts |
| Rotational Magnetic Field | 25–70 Gauss |
| Temperature of Structure 13 | 25–100° C. |

More generally, the process parameters for treating the surface of the dielectric film(s) 60 in a suitable plasma process apparatus (such as the plasma processing apparatus of FIG. 27) fall into ranges as listed in the following Table I and based on flow rates of oxygen gas also listed in the following Table I:

TABLE I

| Process Gas Flow. sccm | Broad | Preferred |
|---|---|---|
| Oxygen ($O_2$) | 10 to 90 | 20 to 80 |
| Pressure, mT | 10 to 250 | 10 to 200 |
| 13.56 MHz | 500 to 2500 | 500 to 1500 |
| Temperature (° C.) of Structure 13 | 10 to 120 | 25 to 100 |
| Magnetic Field Gauss | 10 to 120 | 25 to 70 |

Reactor conditions for a suitable inductively coupled RF plasma reactor, such as the inductively coupled RF plasma reactor 190 in FIGS. 29 and 30, in producing plasma for treating the dielectric film(s) 60 are as follows:

| | |
|---|---|
| Pressure | 7 to 200 mTorr |
| RF Power to Coil Inductor | 200 to 1000 watts |
| RF Power to Pedestal | 100 to 400 watts |
| RF Frequency in Coil Inductor | 2 to 13.5 MHz |
| RF Frequency in Wafer Pedestal | 400K to 13.5 MHz |
| Temperature of Wafer | 100 to 130° C. |

More generally, the process parameters for producing plasma for treating the dielectric film(s) 60 in a suitable inductively coupled plasma reactor, such as the inductively coupled plasma reactor 190 in FIGS. 29 and 30 fall into ranges as listed on the basis of flow rate of the gas $O_2$ as listed in Table V below.

TABLE V

| Process Gas Flow. sccm | Broad | Preferred | Optimum |
|---|---|---|---|
| $O_2$ | 10 to 90 | 15 to 50 | 20 to 40 |
| Pressure, mT | 10 to 400 | 50 to 300 | 100 to 200 |
| RF Power of Coil Inductor (Watts) | 50 to 2000 | 100 to 1200 | 200 to 1000 |
| RF Power of Pedestal (Watts) | 25 to 1000 | 100 to 500 | 200 to 400 |
| Temperature (° C.) of Structure 13 | 20 to 150 | 25 to 125 | 25 to 100 |
| RF Frequency of Coil Inductor | 100K to 200 MHz | 400K to 20 MHz | 2 to 13.5 MHz |
| RF Frequency of Wafer Pedestal | 100K to 200 MHz | 400K to 20 MHz | 400K to 13.5 MHz |

After surface 60a has been produced by treating the dieletric film(s) 60 in accordance with any suitable procedure, such as any of the procedures mentioned in the foregoing, the conductive laminate 20, which may comprise an intermediate dielectric film (not shown, but which would be typically different from the dielectric film(s) 60) is built on top of dielectric film(s) 60.

When conductive laminate 60 buildup is complete, the dielectric film(s) 60 is exposed or the conductive laminate 60 is cut (e.g., by mechanically, chemically, by lasing, etc) to produce openings 90 to more specifically expose the dielectric film(s) 60 (see FIG. 25). The dielectric film(s) 60 may be completely or locally submerged in a liquid (such as water) or vapor (such as steam). This optional fluid treatment may dissolve or reduce the adhesive strength of the dielectric interface (i.e., the interface between the dielectric film(s) 60 and the conductive laminate 20). As best shown in FIG. 26, the conductive laminate 20 may then be peeled, pulled, wedged, air-knifed, fluid-knifed, twisted or sheared off by mechanical means, thus releasing the conductive laminate 20 from the substrate 10, more specifically from the dielectric film(s) 60 supported by the substrate 10. As previously indicated, it has been discovered that peel strengths in excess of about 10 g/cm may damage the conductive laminate 20.

As was seen for bonding materials 45 and/or 50, and for any other layer or film, dielectric film(s) 60 may be either continuous or multiple-disconnected in nature. Dielectric film 60 should have sufficient adhesion to allow buildup of conductive laminate 20 during its manufacture (and CMP). Dielectric film 60 may be used in conjunction with metallic (or non-metallic) layers (or surfaces) that provide strong adhesion. For example, the periphery of the entire substrate 10 may be coated (or treated) with a strongly adhesive layer (or surface) and/or adhesion promoters such as HMDS or DuPont's A-1100 (γ-aminopropyltriethoxysilane) in order to ensure conductive laminate 20 adhesion at the periphery during buildup. Cutting the conductive laminate 20 away from the strongly adhesive regions and inside the weakly adhesive regions then allows conductive laminate 20 removal within the weakly adhesive regions by peeling. Alternatively, an array of small outlines made with strongly adhesive regions may surround weakly adhesive regions and each of the smaller regions may be cut and peeled in the manner described above.

The invention will be illustrated by the following set forth examples which are being given by way of illustration only and not by way of any limitation. All parameters such as concentrations, mixing proportions, temperatures, pressures, rates, compounds, etc., submitted in these examples are not to be construed to unduly limit the scope of the invention.

EXAMPLE I

A 6"×6" square shaped glass ($SiO_2$) substrate was obtained. Sputtered 500 Å films of Au over the interior 5.75"×5.75" area of glass. Adhesion promoter (HMDS) was applied to the 0.25" wide perimeter on glass. Deposited and cured single 10 μm Dupont 2611 polyimide layer over the Au and HMDS layers on the 6"×6" piece of glass. No blistering was observed following the polyimide curing. Laser scribed 5"×5" square through the polyimide and Au metal layers. The 5"×5" square was then subdivided through laser scribing into five 1-inch strips. The adhesive strength was examined by peel tests of the films. A 2.5 Newton load cell was inserted into the Instron. Peels were done over a linear inch to increase signal. On the glass, peel strength for the Au metal film at glass/Au interface was found to be 0.2–0.3 grams/cm (0.0002–0.0003 kg/cm).

EXAMPLE II

Example I was repeated for Au films having 200 Å and 1000 Å thickness and similar results were discovered. Thus, thickness of the Au film had no effect on peel strengths.

EXAMPLE III

Example I was repeated for Pt film and peel strengths at glass/Pt interface were discovered to be from 1 to 2 grams/cm.

EXAMPLE IV

Example I was repeated for Pd film and peel strengths at glass/Pd interface were discovered to be from 1 to 2 grams/cm.

EXAMPLE V

Example I was repeated for Cu film and peel strengths at glass/copper interface was greater than 5 grams/cm. Peel strength started at 5 grams/cm, then increased until Cu film broke.

EXAMPLE VI

Example I was repeated for layer of W(200 Å)/Au(500 Å) and peel strengths at Au/glass interface was discovered to be from 3 to 3.5 grams/cm.

EXAMPLE VII

Example I was repeated except an AlN substrate was used. The adhesion on the AlN ceramic was discovered to be usually higher because of surface roughness (~200–300 Å peak-to-valley surface variation by profilometry). The peel values on the AlN without adhesion promoter or a metallic film were too high to measure with the load cell (>100 g/cm). The peel values on AlN with a 500 Å layer of Au underneath the polyimide were found to be higher than on glass, but acceptable for detachable film construction without undesirably deforming the film. Multi-layer circuits were successfully made on AlN with a 500 Å Au weakly adhesive metallic thin film without undesirably deforming circuit features.

EXAMPLE VIII

The initial process was as follows: 450° C. bakeout of AlN for 60 min, then cool down to room temperature, then spin-on $SiO_2$ coating. A 1,000 rpm spin-on yielded $SiO_2$ coating having a thickness of about 1.1 μm. Then, pre-bake 5 min on hot plate at 200° C. to remove solvents. Subsequently, 425° C. bake $SiO_2$ film for 60 min, followed by $O_2$-plasma treatment under following conditions: 30 min in 200 milliTorr, $O_2$ plasma (350W).

An open structure of 10 μm Dupont 2611 Polyimide (PI) was disposed on the oxygen treated surface. An open structure is one in which water diffusion can readily take place through the thickness of the PI film. In air, peel strengths of ~3.5 g/cm for 10 μm PI single layer deposition were found and no cracking of the $SiO_2$ film was observed. This was essentially the same value as was observed for the Au sputtered films.

EXAMPLE IX

Example VIII was repeated, followed by PCT (pressure cook test with high pressure steam) before testing peel strengths. After PCT, the films were discovered to be self-detached. Similar results were found for 6 successive layers of 10 μm PI buildup, with the results approaching 4 g/cm (this difference due primarily to the thicker, stiffer film) when peeled without PCT.

EXAMPLE X

Example VIII was repeated but with 2000 rpm spin-on speed resulting in about 0.81 μm thick $SiO_2$. The peel results were similar.

EXAMPLE XI

Example VIII was repeated but with 3000 rpm spin-on speed resulting in about 0.64 thick $SiO_2$. The peel results were similar.

EXAMPLE XII

A closed structure of Dupont 2611 Polyimide (PI) was disposed on the oxygen treated surface of the $SiO_2$ coating in Example VIII, instead of an open structure of PI. A closed structure is one in which water diffusion cannot readily take place through the thickness of the PI film. When the PI was blanket coated with sputtered Cr(400 Å)/Cu(4000 Å), water could not get to the interface and peel strengths were much higher than when peeled in air. For blanket Cr/Cu coated PI on bare AlN, the peel strength results were ~40–60 g/cm. Peeling in water or after PCT or with oxygen plasma treatment had no effect. However, for blanket Cr/Cu coated PI on the spin-on-$SiO_2$ upon AlN, the peel strength results changed dramatically according to plasma treatment and water exposure. The peel strengths were ~50–60 g/cm and ~30 g/cm for the untreated and oxygen plasma treated $SiO_2$ surfaces, respectively. When peeled in water, the peel strengths were ~4–7 g/cm and ~1–3 g/cm for the untreated and oxygen plasma treated $SiO_2$ surfaces, respectively.

It is believed that the $O_2$ plasma converts the surface to a form of $SiO_2$ that weakly adheres to the cured PI and this adhesion may be further reduced by species (such as water or hydroxide ions) that may be absorbed at the PI/dielectric interface.

Conclusion

Embodiments of the invention provide for many advantages. For example, because the flexible circuit structure precursors can be separated from the substrate without degrading the substrate, the substrate can be reused. Consequently, less materials are needed to form the flexible circuit structures and processing costs can be reduced. Moreover, in embodiments of the invention, the flexible layers used in forming the circuit structures can be stabilized during processing. After a conductive laminate is formed, it can be easily separated from the supporting substrate (e.g., by peeling). More complicated process such as wet etching or laser ablation are not needed to separate the conductive laminate from the substrate.

The terms and expressions which have been employed herein are used as terms of description and not of limitation, and various modifications to the described embodiments are within the scope of the claimed invention. Moreover, any one or more features of any embodiment of the invention may be combined with any one or more other features of any other embodiment of the invention, without departing from the scope of the invention.

What is claimed is:

1. A method for detaching a layer from a substrate comprising:

depositing a first layer on a substrate;

treating a surface of the first layer to form a treated-surface on the first layer;

forming a second layer on the treated surface; and removing the second layer from the treated surface of the first layer, wherein said treating of said surface of said first layer comprises exposing said surface to a plasma.

2. The method of claim 1 wherein said plasma comprises oxygen plasma.

3. A method for detaching a layer from a substrate comprising:

depositing a first layer on a substrate;

treating a surface of the first layer to form a treated-surface on the first layer;

forming a second layer on the treated surface; and removing the second layer from the treated surface of the first layer, wherein said first layer comprises a dielectric layer, and wherein said treating of said surface of said first layer comprises exposing said surface to a plasma.

4. The method of claim 3 wherein said plasma comprises oxygen plasma.

5. The method of claim 4 wherein said second layer includes a conductive layer.

6. The method of claim 5 wherein said moving of the second layer comprises peeling the second layer from the treated surface, and additionally comprising exposing the first layer to a fluid selected from the group consisting of a liquid, a gas, and mixtures thereof.

7. The method of claim 6 wherein said fluid is selected from the group consisting of water, steam, and mixtures thereof.

8. The method of claim 7 additionally comprising cutting the second layer prior to exposing the first layer to said fluid.

* * * * *